(12) United States Patent
Chien et al.

(10) Patent No.: US 6,284,647 B1
(45) Date of Patent: Sep. 4, 2001

(54) METHOD TO IMPROVE THE UNIFORMITY OF CHEMICAL MECHANICAL POLISHING

(75) Inventors: Sun-Chieh Chien, Hsinchu; Chien-Li Kuo, Hsinchu Hsien; Tzung-Han Lee, Taipei; Wei-Wu Liao, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/216,022

(22) Filed: Dec. 16, 1998

(51) Int. Cl.⁷ ................................................. H01L 21/4163
(52) U.S. Cl. ...................... 438/633; 438/626; 438/631; 438/634; 438/637; 438/692; 438/926
(58) Field of Search ................ 438/14, 124, 424, 438/692, 693, 626, 631, 633, 634, 637, 926; 364/488, 489, 490, 491

(56) References Cited

U.S. PATENT DOCUMENTS

| | | | | |
|---|---|---|---|---|
| 5,492,858 | * | 2/1996 | Bose et al. | 437/67 |
| 5,885,856 | * | 3/1999 | Gilbert et al. | 438/129 |
| 6,109,775 | * | 8/2000 | Tripathi et al. | 364/488 |
| 6,130,457 | * | 10/2000 | Yu et al. | 257/347 |

\* cited by examiner

Primary Examiner—Tan T. Nguyen
Assistant Examiner—Reneé R. Berry
(74) Attorney, Agent, or Firm—Charles C. H. Wu; Charles C. H. Wu & Associates

(57) ABSTRACT

A method of enhancing chemical mechanical polishing uniformity is provided. In the fabrication of a shallow trench isolation structure, there are active area regions with different integration formed in a chip. The integration of the active area regions in the chip is computed according circuit designs by a program analysis. One of the active area regions with the highest integration is used as a basis, dummy mesas are formed in the other active area regions to adjust the integration of the chip.

4 Claims, 4 Drawing Sheets

METHOD TO IMPROVE THE UNIFORMITY OF CHEMICAL MECHANICAL POLISHING

BACKGROUND OF THE INVENTION

1. Field of the Invention

The invention relates in general to a method for fabricating semiconductor integrated circuits (ICs), and more particularly to a chemical mechanical polishing process (CMP) for forming the semiconductor integrated circuits.

2. Description of the Related Art

CMP is now a common and the most reliable technique today for applying in global planarization in very large scale integrated circuits and even in ultra large scale integrated circuits. Therefore, it is of great interest to develop and to improve the CMP technique in order to cut down the cost.

As the IC devices are continuously sized down to a line width of 0.25 μm or even 0.18 μm (deep sub-half micron), employing CMP to planarize the wafer surface, especially to planarize the oxidized surface of the shallow trench, becomes more important. If the opening of the trench is larger than A1, there is a dish formed on the oxide layer in the position of the layer trench from the hardness of the oxide layer which is softer than other materials. The result is called as "dishing effect".

FIGS. 1A–1D are cross-sectional views showing a conventional process of forming a shallow trench isolation structure incorporating CMP technique. As shown in FIG. 1A, a pad oxide layer 101 is formed on a provided substrate 100. A dielectric layer 102 on the pad oxide layer 101. Active areas 103 are divided by trenches after photolithography and etching process.

In FIG. 1B, a oxide layer 104 is formed in the trenches between the active areas 103 and to overflow the dielectric layer 102 using Chemical Vapor Deposition (CVD). The oxide layer 104 is polished by CMP using the dielectric layer 102 as a stop layer. Shallow trench isolation structures 105 and 106 are thus formed in the substrate 100 as shown in FIG. 1C.

As shown in FIG. 1D, the dielectric layer 102 remaining on the active areas 103 of the substrate 100 is removed to complete the shallow trench isolation structures. In follow-up steps, a gate oxide layer 107 and a polysilicon layer 108 are formed on the substrate 100 to form a metal-oxide semiconductor (MOS) transistor or other devices.

Sizes of the trenches between the active areas 103 may be different. As shown in FIG. 1C, the STI structure 106 is larger than the STI structure 105. The top surface of the STI structure 105 is planar, but the top surface of the STI structure 106 is dishing. To prevent the dishing effect occurring at the surface of a large trench during CMP process and to obtain a superior CMP uniformity, a dummy mesa was proposed, incorporated with the CMP technique. The dummy mesa is used as a polishing stop layer within the large trench while the CMP process being performed.

However, there are active area regions with different integration used for different objects on a chip. Simply forming dummy mesas within the large STI structure between the active areas cannot effectively adjust the integration of the global substrate, because the integration of the different active area regions, especially used for memory manufactures such as static random access memory (SRAM) or dynamic random access memory (DRAM), are not the same. Therefore, according to the conventional process, the uniformity of the CMP process can not be controlled effectively.

SUMMARY OF THE INVENTION

It is therefore an object of the present invention to provide a method of enhancing a chemical mechanical polishing uniformity. According to the present invention, the positions of dummy mesas are determined by the integration of different active area regions for different circuit regions on a substrate to make the integrations thereof being the same on the global chip. Therefore, the dishing effect during CMP process can be effectively decreased.

To achieve these and other advantages and in accordance with the purpose of the present invention, as embodied and broadly described herein, this invention provides a method of enhancing chemical mechanical polishing uniformity. In the fabrication of a shallow trench isolation structure, there are active area regions with different integration formed in a chip. The integration of these active area regions in the chip is computed according circuit designs by a computer program analysis. One of the active area regions with the highest density is used as a basis, dummy mesas are formed in the other active regions according a comparing result from analysis to adjust the integration of the chip.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
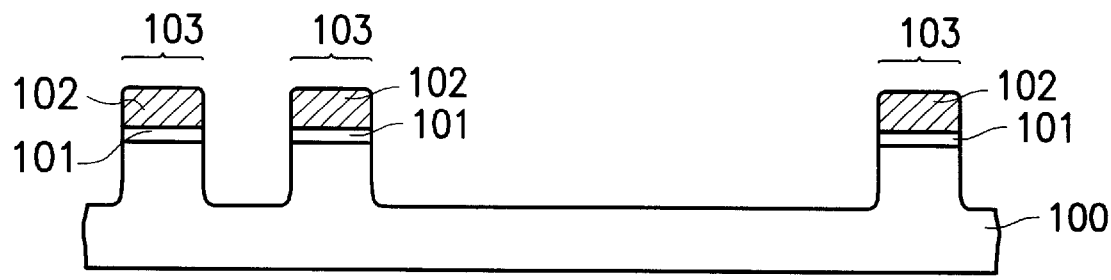
FIGS. 1A–1D are cross-sectional views showing a conventional process of forming a shallow trench isolation structure incorporating CMP technique.
Figure 1B:
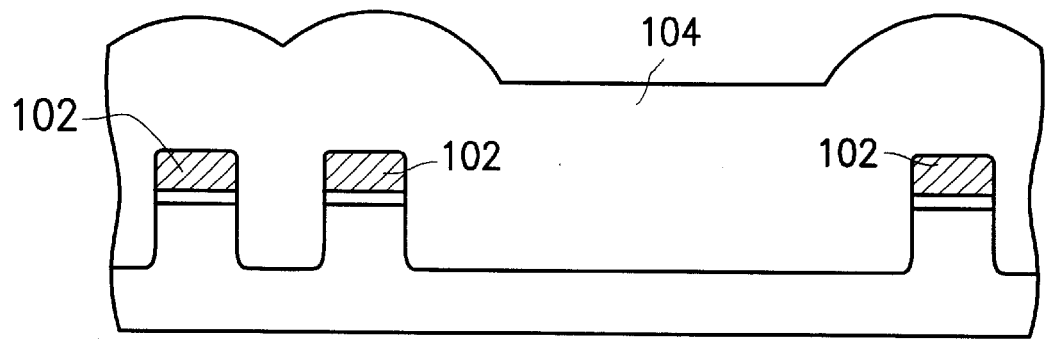
Figure 1C:
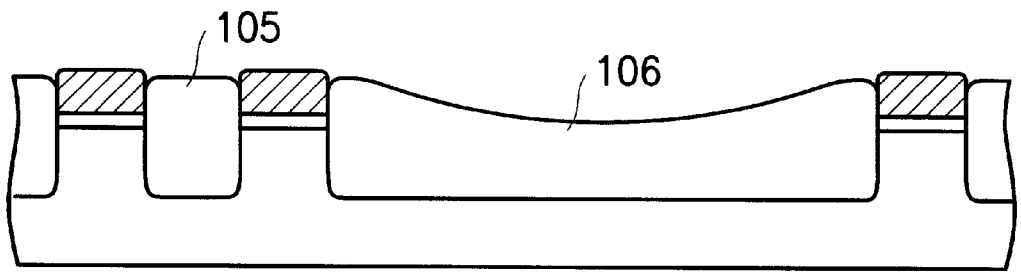
Figure 1D:
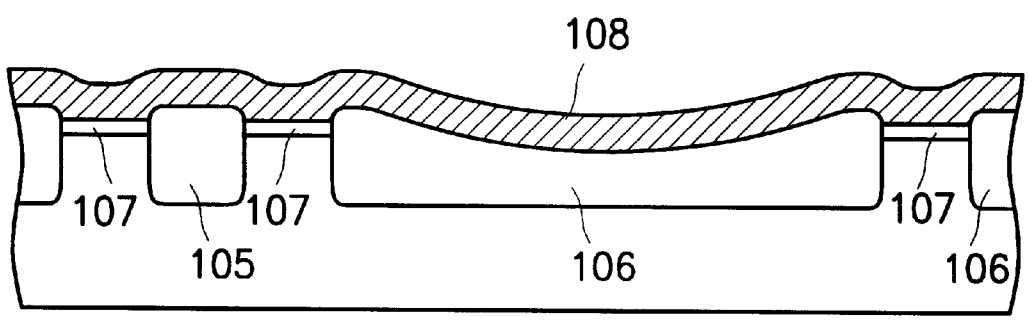
Figure 2A:
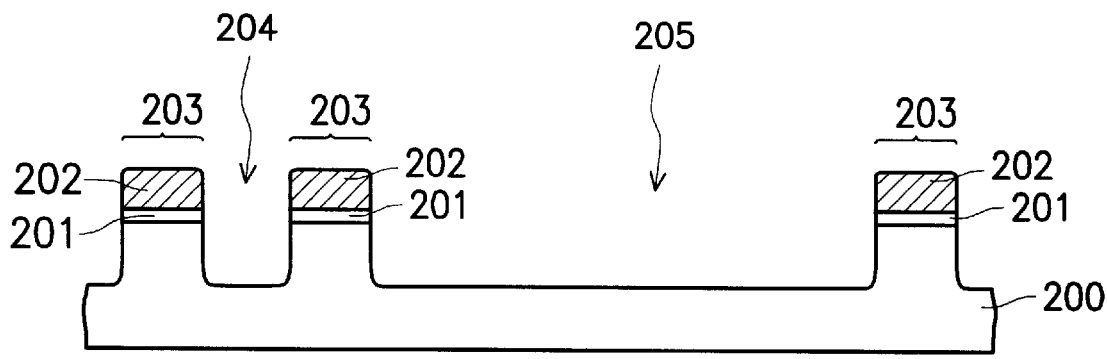
FIGS. 2A–2E are cross-sectional views showing the process of forming a shallow isolation structure with a dummy pattern according to one preferred embodiment of the present invention.

In FIG. 2A, a substrate 200 is provided. A pad oxide layer 201 and an insulating layer 202, such as a silicon nitride layer, are formed on the substrate 200. The pad oxide layer 201 and the insulating layer 202 are defined to form active areas 203 on the substrate 200. Trenches 204 and 205 are formed in the substrate 200 using the remaining insulating layer 202 as a hard mask. Sizes of the trenches 204 and 205 are different as shown in figures. The trenches 204 and 205 isolate active areas of the substrate 200.

Figure 2B:
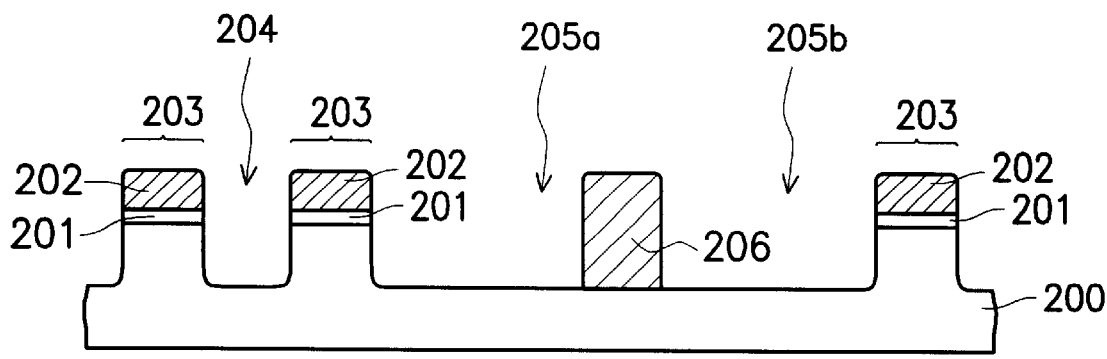

In FIG. 2B, to prevent the dishing effect, a dummy mesa 206 is formed in the large trench 205 to form a small trench 205a and 205b to divide the large trench 205.

The active area regions of the substrate 200 in a chip have different integration. A computer program is provided to analyze each of the active area regions, such as a memory circuit and a peripheral circuit in a chip, and to accurately compute the integration of each active area region. The highest integration of one of the active area regions is used as a standard. According to the comparing result from the program, dummy mesas are formed in trenches of the other active area regions to make all the active area regions have the same integration.

Figure 2C:
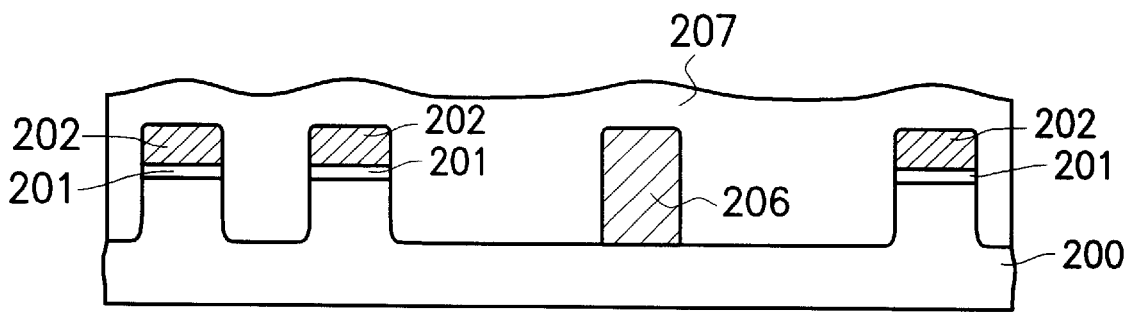
Figure 2D:
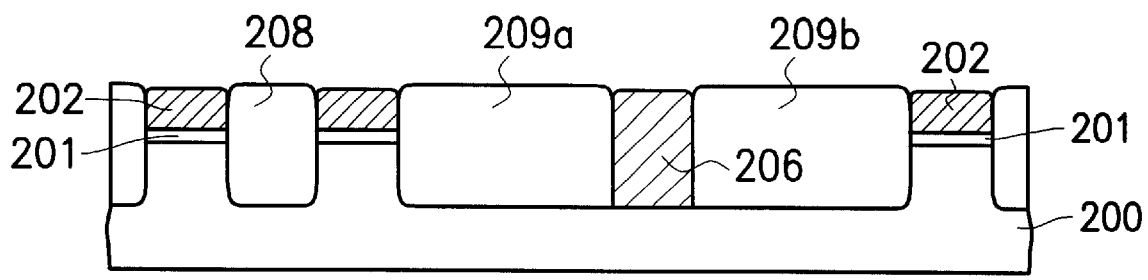

In FIG. 2C, after forming the dummy mesa 206, an oxide layer 207 is formed in the trenches 204, 205a and 205b and to overflow on the insulating layer 202. The oxide layer 207 is removed by CMP to form shallow trench isolation structures 208a, 209a and 209b as shown in FIG. 2D.

Figure 2E:
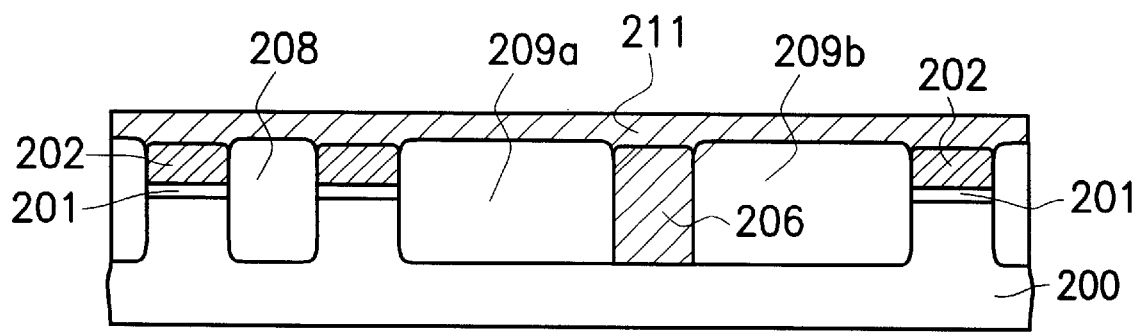

In FIG. 2E, the insulating layer 202 remaining on the active area regions 203 of the substrate 200 is removed to complete the shallow trench isolation structure. In follow-up steps, a gate oxide layer 210 and a polysilicon layer 211 are formed on the substrate 200 to form a metal-oxide semiconductor (MOS) transistor or other devices.

It is noticed that the method of the invention can not only be applied at a chip comprising two kinds of active area regions but also be applied at a chip comprising more than two kinds of active area regions. The chip may comprise a memory circuit, a first peripheral circuit and a second peripheral circuit. The computer program is used to analyze each of the memory circuit, the first peripheral circuit and the second peripheral circuit and to accurately compute the integration of these circuits. According to the result from the program, first dummy mesas are formed in one of these circuits with the lowest density. Second dummy mesas are formed in another of these circuits with the medium density using the other of the circuits with the highest integration as a standard to make these circuits have the same integration.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming shallow trench isolations to avoid the dishing effect occurring on a surface of the shallow trench isolations, comprising the steps of:

providing a substrate having at least a first active area region and a second active area region;

forming a plurality of first trenches in the first active area region and a plurality of second trenches in the second active area region;

computing a first integration of the first trenches in the first active area region and a second integration of the second trenches in the second active area region;

comparing the first integration and the second integration by a computer program;

forming a plurality of dummy mesas in the first trenches and the second trenches to divide the first trenches and the second trenches into a plurality of third trenches and a plurality of fourth trenches, respectively, wherein the third trenches and the fourth trenches have the same integration according to a comparing result from the computer program;

forming an insulating layer over the substrate to fill the third and the fourth trenches; and performing a chemical-mechanical polishing process to remove a portion of the insulating layer until a surface of the dummy mesas is exposed.

2. The method according to claim 1, wherein the first active area region comprises a memory circuit.

3. The method according to claim 1, wherein the second active area region comprises a peripheral circuit.

4. A method for forming shallow trench isolations with a uniform surface level, comprising the steps of:

providing a substrate having a first trench region with a plurality of first trenches and a second trench region with a plurality of second trenches, wherein a trench density of the first trenches in the first trench region is smaller than a trench density of the second trenches in the second trench regions;

forming a plurality of dummy mesas in the first trenches to divide the first trenches into a plurality of third trenches, wherein a trench density of the third trenches in the first trench region is the same as the trench density of the second trenches in the second trench region.

* * * * *